United States Patent
Hasegawa et al.

(10) Patent No.: US 6,717,837 B2
(45) Date of Patent: Apr. 6, 2004

(54) FERROELECTRIC MEMORY DEVICE AND METHOD OF OPERATING MEMORY CELL INCLUDING FERROELECTRIC CAPACITOR

(75) Inventors: Kazumasa Hasegawa, Suwa (JP); Eiji Natori, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 131 days.

(21) Appl. No.: 10/026,903

(22) Filed: Dec. 27, 2001

(65) Prior Publication Data

US 2002/0159307 A1 Oct. 31, 2002

(30) Foreign Application Priority Data

Dec. 27, 2000 (JP) ........................................ 2000-397122
Dec. 26, 2001 (JP) ........................................ 2001-393649

(51) Int. Cl.[7] .............................................. G11C 11/22
(52) U.S. Cl. ................... 365/145; 365/189.04; 365/226
(58) Field of Search ........................... 365/145, 189.04, 365/226

(56) References Cited

U.S. PATENT DOCUMENTS

| 5,487,029 A | 1/1996 | Kuroda ........................ 365/145 |
|---|---|---|
| 5,532,953 A * | 7/1996 | Ruesch et al. ............... 365/145 |
| 5,550,770 A | 8/1996 | Kuroda ........................ 365/145 |
| 5,666,305 A | 9/1997 | Mihara et al. ............... 365/145 |
| 5,822,237 A * | 10/1998 | Wilson et al. ............... 365/145 |
| 5,909,389 A * | 6/1999 | Kawakubo et al. .......... 365/145 |
| 6,690,599 B2 | 2/2004 | Hasegawa et al. .......... 365/145 |

FOREIGN PATENT DOCUMENTS

| JP | A 6-77434 | 3/1994 |
|---|---|---|
| JP | A 8-147982 | 6/1996 |
| JP | A 9-116107 | 5/1997 |

\* cited by examiner

*Primary Examiner*—Van Thu Nguyen
*Assistant Examiner*—Pho M. Luu
(74) *Attorney, Agent, or Firm*—Oliff & Berridge, PLC

(57) ABSTRACT

A ferroelectric memory device includes memory cells including ferroelectric capacitors formed in regions in which first signal electrodes intersect second signal electrodes. Information is written into a selected memory cell by applying a write voltage between one of the first signal electrodes and one of the second signal electrodes in the memory cell. Information is read from the selected memory cell by applying a read voltage between one of the first signal electrodes and one of the second signal electrodes in the memory cell. Provided that the write voltage is ±Vs and the read voltage is either +Vs or −Vs, |Vs| is less than the absolute value of a saturation voltage at which remanent polarization of the ferroelectric capacitors is saturated.

36 Claims, 9 Drawing Sheets

FERROELECTRIC MEMORY DEVICE AND METHOD OF OPERATING MEMORY CELL INCLUDING FERROELECTRIC CAPACITOR

Japanese Patent Application No. 2000-397122, filed on Dec. 27, 2000, is hereby incorporated by reference in its entirety.

BACKGROUND OF THE INVENTION

The present invention relates to a ferroelectric memory device and a method of operating memory cells including ferroelectric capacitors. More particularly, the present invention relates to a simple matrix type ferroelectric memory device and a method of operating memory cells including ferroelectric capacitors.

A simple matrix type ferroelectric memory device using only ferroelectric capacitors instead of cell transistors has a very simple structure and enables a higher degree of integration. Therefore, development of such a memory device has been expected.

Japanese Patent Application Laid-open No. 9-116107 discloses technology relating to a simple matrix type ferroelectric memory device and an operation method therefor.

A method of writing and reading data disclosed in Japanese Patent Application Laid-open No. 9-116107 is described below. FIG. 7 is a view showing a memory cell array of a ferroelectric memory device.

The method of writing data is described below. FIG. 8 is a timing chart in the case of writing data "1" into a ferroelectric capacitor Cm,N and writing data "0" into Cm,N+1. In the technology according to Japanese Patent Application Laid-open No. 9-116107, the data "1" is written into a memory cell by applying a voltage in a direction so that the potential of a selected sub-bit line is higher than the potential of a selected word line. The data "0" is written into the memory cell by applying a voltage in a direction so that the potential of the selected sub-bit line is lower than the potential of the selected word line.

Main bit lines MBLN and MBLN+1 are set to a ground voltage (0 V) at time t1. At the same time, a selection gate line SL is set to 5 V from 0 V, a selected word line WLm is set to a power supply voltage VCC (3.3 V), and all non-selected word lines WL1-WLM are set to the ground voltage (0 V). This causes the contents of the ferroelectric capacitors Cm,N and Cm,N+1 to be erased (data "0" is written).

At time t2, the selection gate line SL and the selected word line WLm are set to the ground voltage (0 V), the main bit line MBLN is set to the power supply voltage VCC (3.3 V), and the main bit line MBLN+1 is set to (⅓) VCC (1.1 V).

At time t3, the selection gate line SL is set to 5 V, the selected word line WLm is set to the ground voltage (0 V), and the non-selected word lines WL1-WLM are set to (⅔) VCC (2.2 V). This causes the data "1" to be written into the ferroelectric capacitor Cm,N.

At time t4, the main bit lines MBLN and MBLN+1 are set to (⅓) VCC (1.1 V), and the selection gate line SL and the word lines WL1-WLM are set to the ground voltage (0 V), whereby the write operation is completed.

The method of reading data is described below. FIG. 9 is a timing chart in the case of reading the data "1" stored in the memory cell Cm,N and reading the data "0" stored in the memory cell Cm,N+1, and rewriting the data "1" into the memory cell Cm,N and rewriting the data "0" into Cm,N+1.

At time t1, a precharge signal φPC is set to the power supply voltage VCC (3.3 V), and a column select signal φ is set to 5 V. This causes the main bit lines MBLN and MBLN+1 to be precharged to a precharge voltage VPC (0 V) before time t2. The main bit lines MBLN and MBLN+1 are respectively connected to nodes VN and VN+1 of sense amplifiers.

A time t2, the precharge signal φPC is set to 0 V, thereby causing the main bit lines MBLN and MBLN+1 to be in a floating state. The selection gate line SL is set to 5 V from 0 V, and the selected word line WLm is set to the power supply voltage VCC (3.3 V) from 0 V. This causes the ferroelectric capacitors Cm,N and Cm,N+1 to be in a polarization state in which the data "0" is written.

At time t3, the selection gate line SL and the selected word line WLm are set to 0 V. At time t4, a sense enable signal φSE is set to the power supply voltage VCC (3.3 V). This causes sense amplifiers SAN and SAN+1 to be activated. As a result, the data "1" is latched by the sense amplifier SAN before time t5, whereby the potential of the main bit line MBLN is set to the power supply voltage VCC (3.3 V). The data "0" is latched by the sense amplifier SAN+1, whereby the potential of the main bit line MBLN+1 is set to the ground voltage (0 V) The read operation is performed in this manner.

Since steps after time t5 are rewriting steps, description thereof is omitted.

BRIEF SUMMARY OF THE INVENTION

The present invention may provide a ferroelectric memory device and a method of operating memory cells including ferroelectric capacitors capable of preventing malfunctions of the ferroelectric memory device.

1. Ferroelectric memory device (A) A first ferroelectric memory device of the present invention comprises:
first signal electrodes, a ferroelectric layer, and second signal electrodes,
wherein the second signal electrodes are formed along a direction which intersects with the first signal electrodes,
wherein memory cells each of which comprises a ferroelectric capacitor including at least one of the first signal electrodes, one of the second signal electrodes, and the ferroelectric layer, are formed in regions in which the first signal electrodes intersect the second signal electrodes,
wherein information is written into a selected memory cell by applying a write voltage between one of the first signal electrodes and one of the second signal electrodes in the selected memory cell, and
wherein an absolute value of the write voltage is less than an absolute value of a saturation voltage at which remanent polarization of the ferroelectric capacitor is saturated.

In this aspect of the present invention, the absolute value of the write voltage is less than the absolute value of the saturation voltage. This enables the difference between switching polarization and non-switching polarization to be increased in comparison with the case of setting the write voltage the same as the saturation voltage. Therefore, the difference in bit line potential between reading of first data and reading of second data can be increased, whereby malfunctions can be decreased.

The ferroelectric memory device of this aspect of the present invention may have any of the following features.

(a) Information may be read from a selected memory cell by applying a read voltage between one of the first signal electrodes and one of the second signal electrodes in the selected memory cell, and an absolute value of the read voltage may be less than an absolute value of a saturation voltage.

In this case, the absolute value of the write voltage may be the same as the absolute value of the read voltage.

In addition, while information is read from a selected memory cell, part of information may be written into the selected memory cell.

(b) A first voltage which prevents polarization inversion of a non-selected memory cell may be applied between one of the first signal electrodes and one of the second signal electrodes in the non-selected memory cell when information is written into the selected memory cell, and the maximum absolute value of the first voltage may be half of the absolute value of the write voltage.

(c) A second voltage which prevents polarization inversion of a non-selected memory cell may be applied between one of the first signal electrodes and one of the second signal electrodes in the non-selected memory cell when information is read from the selected memory cell, and the maximum absolute value of the second voltage may be half of the absolute value of the read voltage.

(B) A second ferroelectric memory device of the present invention comprises:

first signal electrodes, a ferroelectric layer, and second signal electrodes, wherein the second signal electrodes are formed along a direction which intersects the first signal electrodes, wherein memory cells each of which comprises a ferroelectric capacitor including at least one of the first signal electrodes, one of the second signal electrodes, and the ferroelectric layer, are formed in regions in which the first signal electrodes intersect the second signal electrodes, wherein information is written into a selected memory cell by applying a write voltage between one of the first signal electrodes and one of the second signal electrodes in the selected memory cell, wherein information is read from the selected memory cell by applying a read voltage between one of the first signal electrodes and one of the second signal electrodes in the selected memory cell, and wherein, provided that the write voltage is ±Vs and the read voltage is one of +Vs and −Vs, |Vs| is less than an absolute value of a saturation voltage at which remanent polarization of the ferroelectric capacitor is saturated.

In this aspect of the present invention, |Vs| is less than the absolute value of the saturation voltage at which remanent polarization of the ferroelectric capacitor is saturated. Therefore, the write voltage is less than the saturation voltage. As a result, effects the same as those of the first ferroelectric memory device of the present invention can be achieved.

The second ferroelectric memory device of the present invention may have any of the following features.

(a) A first voltage which prevents polarization inversion of a non-selected memory cell may be applied between one of the first signal electrodes and one of the second signal electrodes in the non-selected memory cell when information is written into the selected memory cell, and wherein the maximum absolute value of the first voltage may be (½) |Vs|.

(b) A second voltage which prevents polarization inversion of a non-selected memory cell may be applied between one of the first signal electrodes and one of the second signal electrodes in the non-selected memory cell when information is read from the selected memory cell, and the maximum absolute value of the second voltage may be (½) |Vs|.

In the first and second ferroelectric memory devices of the present invention, the ferroelectric layer may be formed of a perovskite-type oxide ferroelectric.

The ratio of the absolute value of the write voltage to the thickness of the ferroelectric layer is preferably 17 V/μm or less, and still more preferably 15 V/μm or less.

The ferroelectric layer is formed of a material having a relative dielectric constant of preferably 400 or less, and still more preferably 300 or less in a state in which the bias voltage is not applied.

2. Method of Operating Memory Cell (A) In a first method of operating memory cells including ferroelectric capacitors of the present invention, each of the memory cells comprises a first signal electrode, a ferroelectric layer, and a second signal electrode, the second signal electrode is formed along a direction which intersects with the first signal electrode, each of the memory cells comprises at least the first signal electrode, the second signal electrode, and the ferroelectric layer in a region in which the first signal electrode intersects the second signal electrode, the method comprises:

a step of writing information into a selected memory cell by applying a write voltage between the first signal electrode and the second signal electrode in the selected memory cell, wherein an absolute value of the write voltage is less than an absolute value of a saturation voltage at which remanent polarization of the ferroelectric capacitors is saturated.

According to the operation method of this aspect of the present invention, the absolute value of the write voltage is set less than the absolute value of the saturation voltage when writing information into the memory cell. Therefore, the difference between switching polarization and non-switching polarization can be increased in comparison with the case of setting the write voltage the same as the saturation voltage. Therefore, the difference in bit line potential between reading of the first data and reading of the second data can be increased, whereby malfunctions can be further decreased.

The first method of operating a memory cell of the present invention may have any of the following features.

(a) The method may further comprises:

a step of reading information from the selected memory cell by applying a read voltage between the first signal electrode and the second signal electrode in the selected memory cell, wherein an absolute value of the read voltage may be less than an absolute value of a saturation voltage at which remanent polarization of the ferroelectric capacitors is saturated.

In this case, the absolute value of the write voltage may be the same as the absolute value of the read voltage.

In addition, while information is read from a selected memory cell, part of information may be written into the selected memory cell.

(b) A first voltage which prevents polarization inversion of a non-selected memory cell may be applied between the first signal electrode and the second signal electrode in the non-selected memory cell when information is written into the selected memory cell, and the maximum absolute value of the first voltage may be half of the absolute value of the write voltage.

(c) A second voltage which prevents polarization inversion of a non-selected memory cell may be applied between the first signal electrode and the second signal electrode in the non-selected memory cell when information is read from the selected memory cell, and the maximum absolute value of the second voltage may be half of the absolute value of the read voltage.

(B) In a second method of operating memory cells including ferroelectric capacitors of the present invention, each of the memory cells comprises a first signal electrode, a ferroelectric layer, and a second signal electrode, the second signal electrode is formed along a direction which intersects with the first signal electrode, each of the memory cells comprises at least the first signal electrode, the second signal electrode, and the ferroelectric layer in a region in which the first signal electrode intersects the second signal electrode, the method comprises:

a step of writing information into a the selected memory cell by applying a write voltage between the first signal electrode and the second signal electrode in the selected memory cell, and a step of reading information from the selected memory cell by applying a read voltage between the first signal electrode and the second signal electrode in the selected memory cell, wherein, provided that the write voltage is ±Vs and the read voltage is one of +Vs and −Vs, |Vs| is less than an absolute value of a saturation voltage at which remanent polarization of the ferroelectric capacitors is saturated.

In the second method of operating memory cells of the present invention, the absolute value |Vs| of the write voltage is less than the absolute value of the saturation voltage. Therefore, effects the same as those of the first method of operating memory cells of the present invention can be achieved.

The second method of operating memory cells of the present invention may have any of the following features.

(a) A first voltage which prevents polarization inversion of a non-selected memory cell may be applied between the first signal electrode and the second signal electrode in the non-selected memory cell when information is written into the selected memory cell, and the maximum absolute value of the first voltage may be (½) |Vs|.

(b) A second voltage which prevents polarization inversion of a non-selected memory cell may be applied between the first signal electrode and the second signal electrode in the non-selected memory cell when information is read from the selected memory cell, and the maximum absolute value of the second voltage may be (½) |Vs|.

In the first and second method of operating a memory cell of the present invention, the ferroelectric layer may be formed of a perovskite-type oxide ferroelectric.

DETAILED DESCRIPTION OF THE EMBODIMENT

A preferred embodiment of the present invention is described below with reference to the drawings.

1. Structure of Ferroelectric Memory Device

Figure 1:
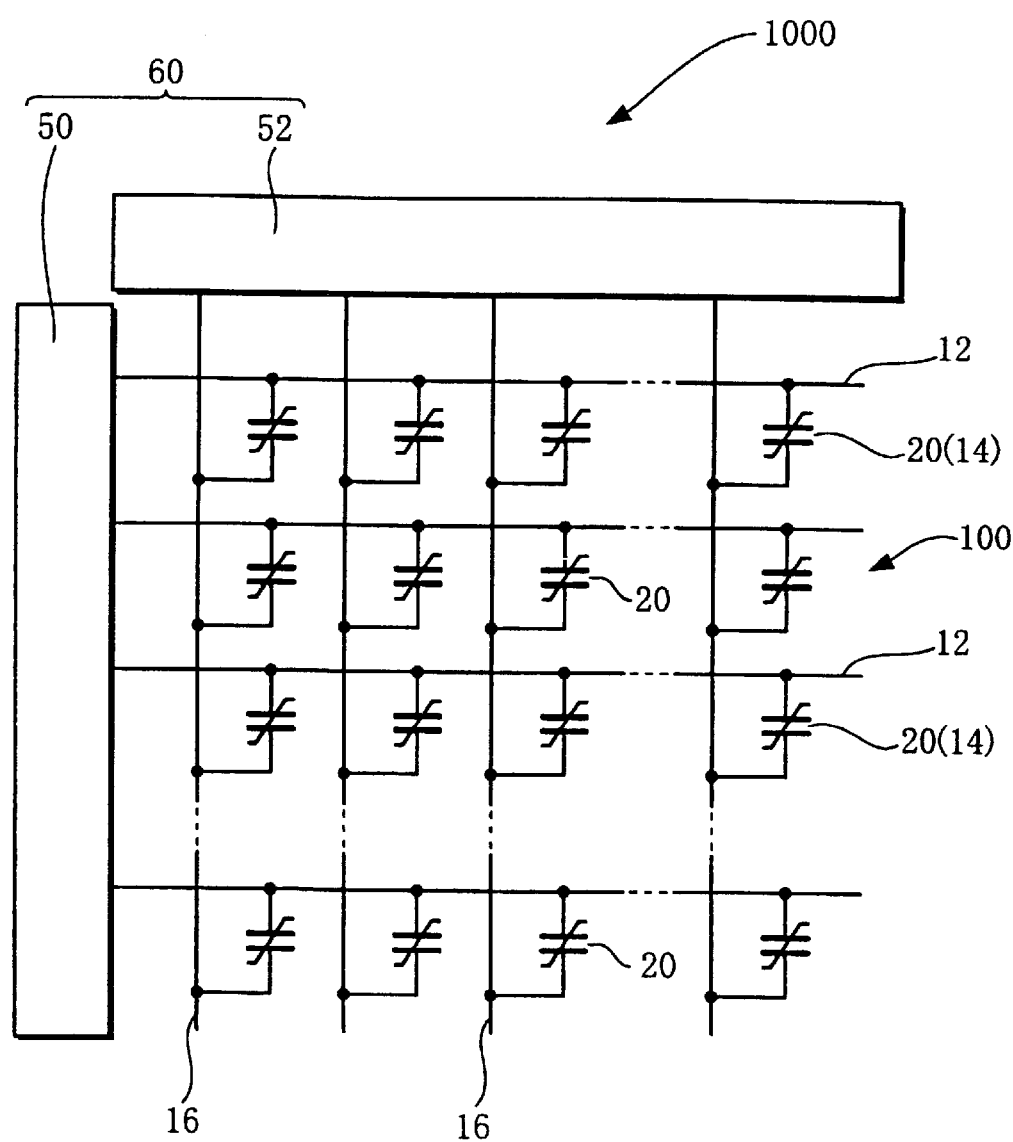
FIG. 1 is a plan view schematically showing a ferroelectric memory device.
Figure 2:
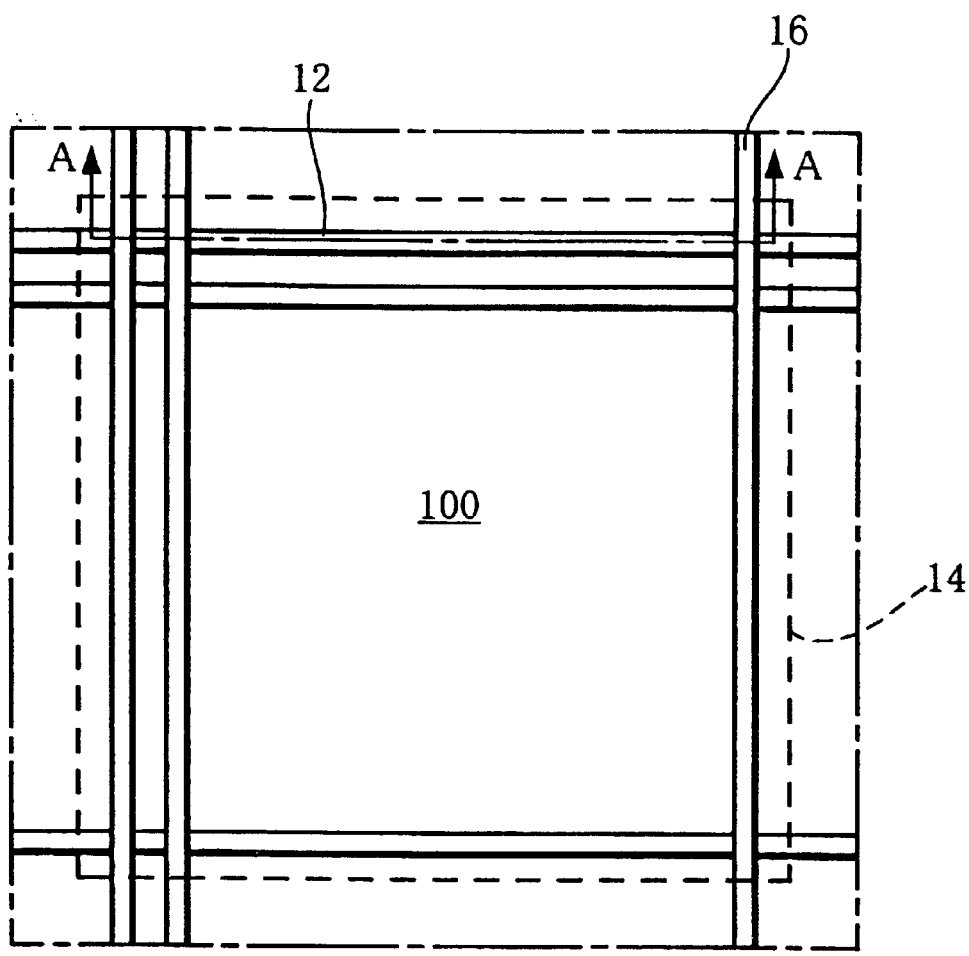
FIG. 2 is a plan view schematically showing a layout of the pattern of the ferroelectric memory device.
Figure 3:
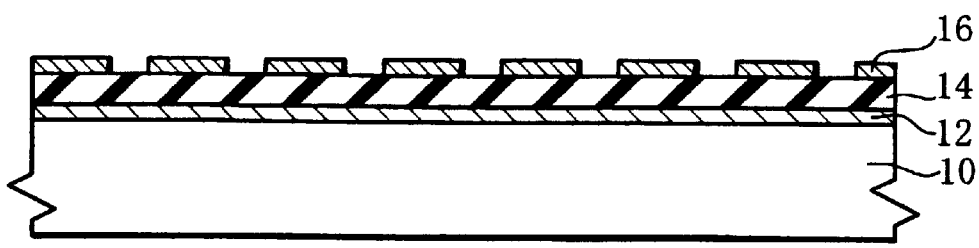
FIG. 3 is a cross-sectional view schematically showing part of the ferroelectric memory device along the line A—A shown in FIG. 2.

FIG. 1 is a plan view schematically showing a ferroelectric memory device. FIG. 2 is a plan view schematically showing a layout of the pattern of the ferroelectric memory device. FIG. 3 is a cross-sectional view schematically showing part of the ferroelectric memory device along the line A—A shown in FIG. 2.

A ferroelectric memory device 1000 of the present embodiment includes a memory cell array 100.

In the memory cell array 100, first signal electrodes (word lines) 12 for selecting rows and second signal electrodes (bit lines) 16 for selecting columns are arranged to intersect at right angles. The first signal electrodes may be the bit lines and the second signal electrodes may be the word lines, differing from this example.

A ferroelectric layer 14 is disposed at least between the first signal electrodes 12 and the second signal electrodes 16, as shown in FIG. 2. Therefore, memory cells 20, each of which includes a ferroelectric capacitor, are formed at each intersection between the first signal electrodes 12 and the second signal electrodes 16. The ferroelectric layer 14 is formed to be continuous between the adjacent memory cells. Specifically, the ferroelectric layer 14 is continuously formed in the formation region of the memory cell array.

A peripheral circuit section 60 including various types of circuits for selectively causing information to be written into or read from the memory cells is formed. The peripheral circuit section 60 includes a first driver circuit 50 for selectively controlling the first signal electrodes 12, a second driver circuit 52 for selectively controlling the second signal electrodes 16, and a signal detecting circuit (not shown) such as a sense amplifier, for example. As specific examples of the peripheral circuit section 60, a Y gate, sense amplifier, input-output buffer, X address decoder, Y address decoder, and address buffer can be given.

2. Write/Read Method

An example of read and write operations of the ferroelectric memory device 1000 of the present embodiment is described below.

In the following description, a case of writing data by polarizing the ferroelectric capacitor by setting the potential of the bit line 16 higher than that of the word line 12 is defined as writing of data "1". A case of writing data by polarizing the ferroelectric capacitor by setting the potential of the word line 12 higher than that of the bit line 16 is defined as writing of data "0". The sign of a write voltage Vwrite is positive (+) when the potential of the bit line 16 is higher than that of the word line 12, and is negative (−) when the potential of the bit line 16 is lower than that of the word line 12. In other words, data "1" is written when the positive write voltage Vwrite is applied between the bit line 16 and the word line 12, and data "0" is written when the negative write voltage is applied between the bit line 16 and the word line 12.

The sign of a read voltage Vread is positive (+) when the potential of the bit line 16 is higher than that of the word line 12, and is negative (−) when the potential of the bit line 16 is lower than that of the word line 12.

2.1 Write Operation

An example of the write operation is described below. Note that all the selected memory cells are in a state of storing data "0". All the selected memory cells may be caused to store data "0" by applying the negative write voltage −Vwrite between the bit line 16 and the word line 12 in all the selected memory cells, for example. The absolute value of the negative write voltage −Vwrite is set less than the absolute value of the negative saturation voltage. The absolute value of the negative write voltage −Vwrite is preferably 90% or less, still more preferably 30 to 75%, and particularly preferably 45 to 60% of the absolute value of the negative saturation voltage.

The positive write voltage +Vwrite is applied between the bit line 16 and the word line 12 in the selected memory cell into which it is desired to write the data "1". The absolute value of the positive write voltage +Vwrite is set less than the absolute value of the positive saturation voltage. The absolute value of the positive write voltage +Vwrite is preferably 90% or less, still more preferably 30 to 75%, and particularly preferably 45 to 60% of the absolute value of the positive saturation voltage. During the write operation of the data "1", a voltage which does not cause polarization inversion of the selected memory cell in which it is desired to hold the data "0" is applied between the bit line 16 and the word line 12 in this selected memory cell. Therefore, since the polarization of the selected memory cell in which it is desired to hold the data "0" is not inverted, the data "0" is held.

When writing the data "1", a specific voltage is applied to the capacitors in the non-selected memory cells in order to prevent occurrence of cross talk during the write operation. Specifically, a first voltage which does not cause polarization inversion of the non-selected memory cells is applied between the bit line 16 and the word line 12 in the non-selected memory cells. The maximum absolute value of the first voltage is half the absolute value of the write voltage, and preferably one-third the absolute value of the write voltage. The data "0" and data "1" can be written into the selected memory cells in this manner.

The write operation is not limited to the above example. The write operation may be modified as follows.

(1) After causing all the selected memory cells to store the data "1", the data "0" and data "1" may be written into the selected memory cells by changing only the data of a specific selected memory cell into the data "0".

(2) The absolute value of the positive write voltage +Vwrite and the absolute value of the negative write voltage −Vwrite may be the same or different.

Technology disclosed in Japanese Patent Application Laid-open No. 9-116107 may be applied to the operations of the ferroelectric memory device, except for setting the absolute value of the write voltage less than the absolute value of the saturation voltage.

2.2 Read Operation

The read operation is described below.

A positive read voltage +Vread is applied between the bit line 16 and the word line 12 in the selected memory cells. At this time, current flowing through the selected bit line 16 or a potential when causing the bit line 16 to be in a high impedance state is read by the sense amplifier, whereby the data of the selected memory cells is read. In the read operations, data may be read by applying the negative read voltage −Vread.

The read operations may be allowed to serve as rewriting of the data "1" or "0". In this case, the absolute value of the read voltage ±Vwrite is less than the absolute value of the saturation voltage. The absolute value of the read voltage ±Vwrite is preferably 90% or less, still more preferably 30 to 75%, and particularly preferably 45 to 60% of the absolute value of the saturation voltage. In this case, a specific voltage is applied to the capacitors in the non-selected memory cells in order to prevent occurrence of cross talk during the read operations. Specifically, a second voltage which does not cause polarization inversion of the non-selected memory cells is applied between the bit line 16 and the word line 12 in the non-selected memory cells. The maximum absolute value of the second voltage is half the absolute value of the read voltage, and preferably one-third the absolute value of the read voltage.

3. Effect

Effects of the ferroelectric memory device are described below.

In the present embodiment, the absolute value of the write voltage is set less than the absolute value of the saturation voltage. This enables the difference between switching polarization and non-switching polarization to be increased in comparison with the case of setting the write voltage equal to the saturation voltage. Therefore, the difference in bit line potential between reading of the data "1" and reading of the data "0" can be increased, whereby malfunctions can be further decreased.

Figure 4:
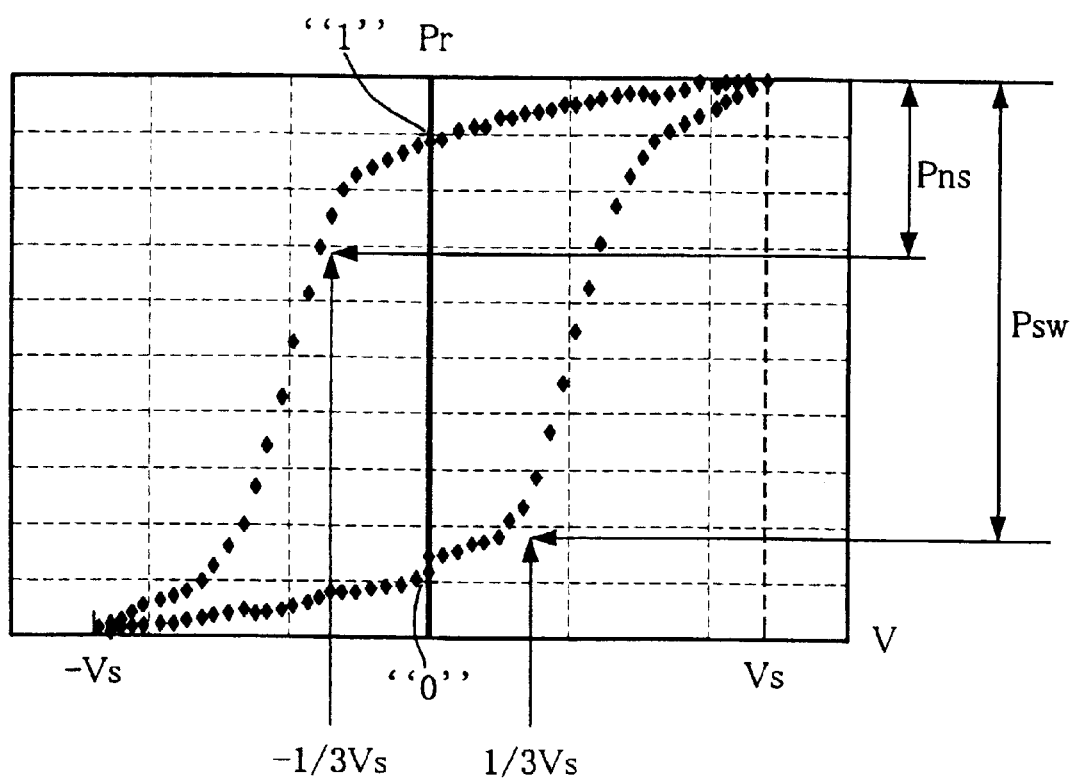
FIG. 4 is a graph showing hysteresis characteristics of a ferroelectric capacitor for describing switching polarization and non-switching polarization.

The switching polarization and non-switching polarization are described below. FIG. 4 shows hysteresis characteristics of the ferroelectric capacitor. In FIG. 4, Psw indicates the switching polarization, and Pns indicates the non-switching polarization. Specifically, in the case of reading data by changing the polarization state of the selected memory cell into the data "1", the switching polarization is the difference in polarization between before and after reading of the selected memory cell in which the data "0" is stored, and the non-switching polarization is the difference in polarization between before and after reading of the selected memory cell in which the data "1" is stored. In more detail, Psw is the difference in polarization in the case of reading data from the memory cell in which the data "0" is written by applying Vs to the memory cell to which (⅓) Vs is applied. Pns is the difference in polarization in the case of reading data from the memory cell in which the data "1" is written by applying Vs to the memory cell to which (−⅓) Vs is applied.

In the case where the absolute values of the first voltage and the second voltage applied to the non-selected memory cells are respectively half the absolute values of the write voltage and the read voltage, Psw is the difference in polarization in the case of reading data from the memory cell in which the data "0" is written by applying Vs to the memory cell to which (½) Vs is applied, and Pns is the difference in polarization in the case of reading data from the memory cell in which the data "1" is written by applying Vs to the memory cell to which (–½) Vs is applied.

Figure 5:
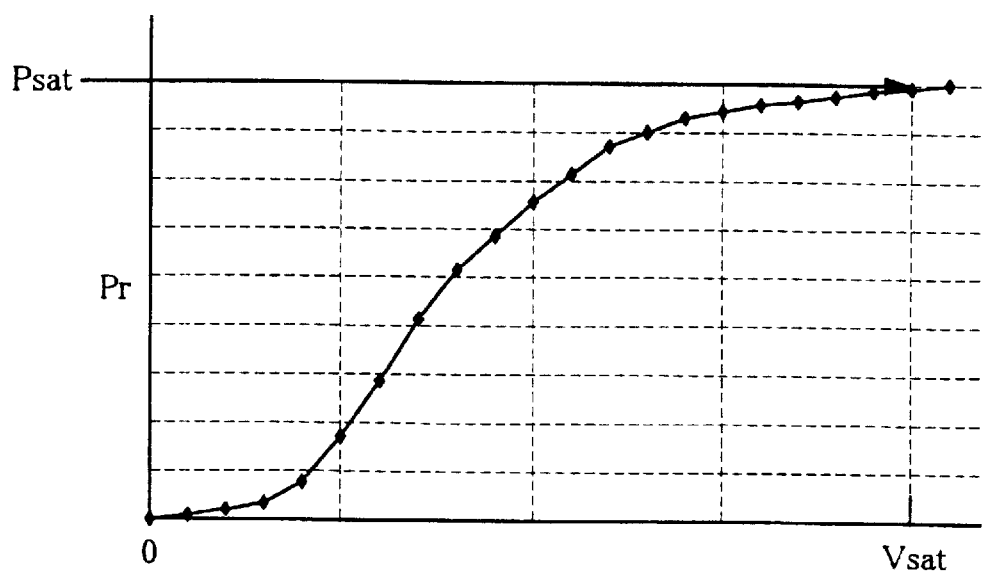
FIG. 5 is a graph showing the relation between a voltage applied between a bit line and a word line and polarization for describing a saturation voltage.

The saturation voltage is defined below. The saturation voltage is a voltage at which the remanent polarization of the ferroelectric capacitor is saturated. Specifically, when increasing the potential of the bit line with respect to the word line, the positive saturation voltage is a voltage at which the polarization Pr is not increased even if the potential is further increased. More specifically, the positive saturation voltage is an applied voltage Vsat at saturation polarization Psat shown in FIG. 5. On the contrary, when decreasing the potential of the bit line with respect to the word line, the negative saturation voltage is a voltage at which the polarization Pr is not decreased even if the potential is further decreased.

4. Device Fabrication Method

An example of a method of fabricating the above-described memory cell array is described below. FIG. 3 is a cross-sectional view schematically showing a step of fabricating the memory cell array 100.

The first signal electrodes 12 are formed on a substrate 10. As a material for the first signal electrodes 12, Ir, $IrO_x$, Pt, $RuO_x$, $SrRuO_x$, and $LaSrCoO_x$ can be given. As a method of forming the first signal electrodes 12, sputtering, vapor deposition, and the like can be given. The first signal electrodes 12 may have either a single layer structure or a multilayer structure in which a plurality of layers is provided.

The first signal electrodes 12 are patterned by etching. As a method of etching the first signal electrodes 12, RIE, sputter etching, plasma etching, and the like can be given.

The ferroelectric layer 14 is formed on the substrate 10 on which the first signal electrodes 12 are formed. As a material for the ferroelectric layer, perovskite-type oxide ferroelectrics (such as $SrBi_2Ta_2O_9$) can be given. In the case of using $SrBi_2Ta_2O_9$, the relative dielectric constant of the material is 250–400 in a state in which the bias voltage is not applied, although the value varies depending on unevenness of the composition, production method, and the like. There are no specific limitations to the material for the ferroelectric layer 14. A material having a relative dielectric constant of preferably 400 or less, and still more preferably 300 or less in a state in which the bias voltage is not applied is used. As the material for the ferroelectric layer 14, in addition to $SrBi_2Ta_2O_9$, SBT materials having different compositions of the same elements, $SrBi_2Nb_2O_9$ materials, and the like can be used. As a method of forming the ferroelectric layer 14, a spin coating process or a dipping process using a sol-gel material or MOD material, a sputtering process, an MOCVD process, and a laser ablation process can be given. There are no specific limitations to the thickness of the ferroelectric layer. Provided that the absolute value of the write voltage is |Vwrite| (V) and the thickness of the ferroelectric layer is T1 ($\mu$m), the thickness of the ferroelectric layer preferably satisfies the following relation. Specifically, the thickness of the ferroelectric layer satisfies preferably $|Vwrite|/T1 \leq 17$ (V/$\mu$m), and still more preferably $|Vwrite|/T1 \leq 15$ (V/$\mu$m).

The ferroelectric layer 14 is patterned by etching.

The second signal electrodes 16 are formed on the ferroelectric layer 14. As a material and a method of forming the second signal electrodes 16, materials and methods the same as those for the first signal electrodes 12 may be applied. The second signal electrodes 16 are patterned by etching. As a method of etching the second signal electrodes 16, methods the same as those for the first signal electrodes 12 may be applied. The memory cell array 100 is formed in this manner.

5. Modification Example

The above embodiment may be modified as follows.

In the above embodiment, the ferroelectric layer 14 is continuously formed in the formation region of the memory cell array 100. However, the present embodiment is not limited thereto. The embodiment may have any of the following features: 1) The ferroelectric layers 14 are formed linearly along the first signal electrodes 12; 2) the ferroelectric layers 14 are formed linearly along the second signal electrodes 16; and 3) the ferroelectric layers 14 are formed only at intersections between the first electrode 12 and the second electrode 16.

Figure 6:
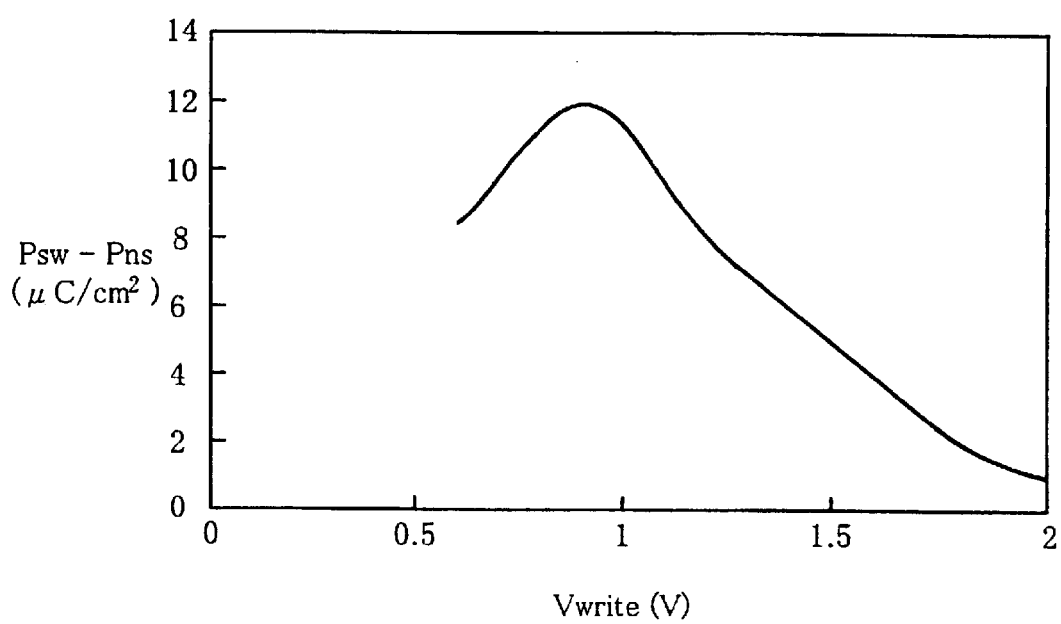
FIG. 6 is a graph showing the relation between a write voltage Vwrite and Psw-Pns.
Figure 7:
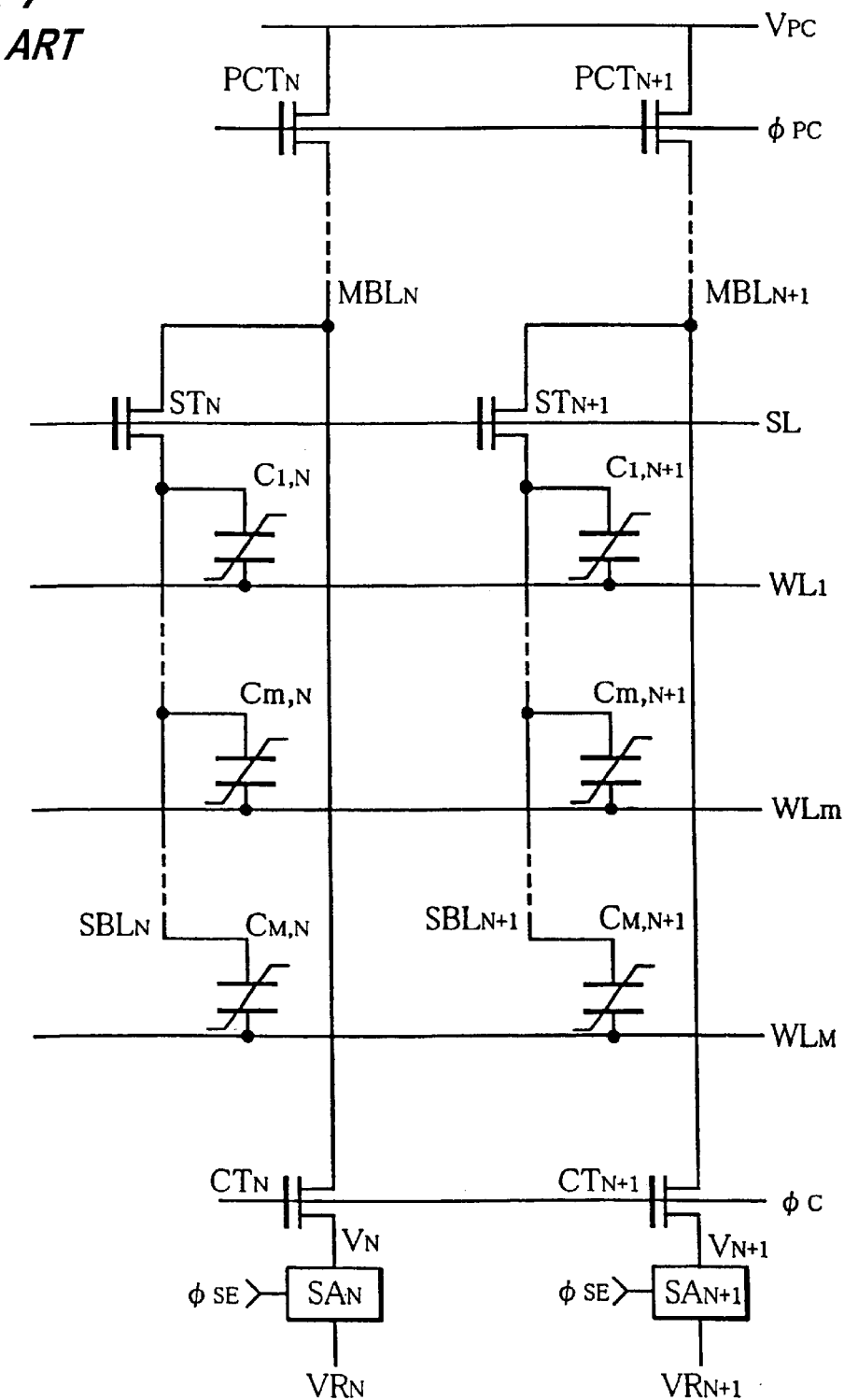
FIG. 7 is a view showing a memory cell array of an ferroelectric memory device according to a conventional example.
Figure 8:
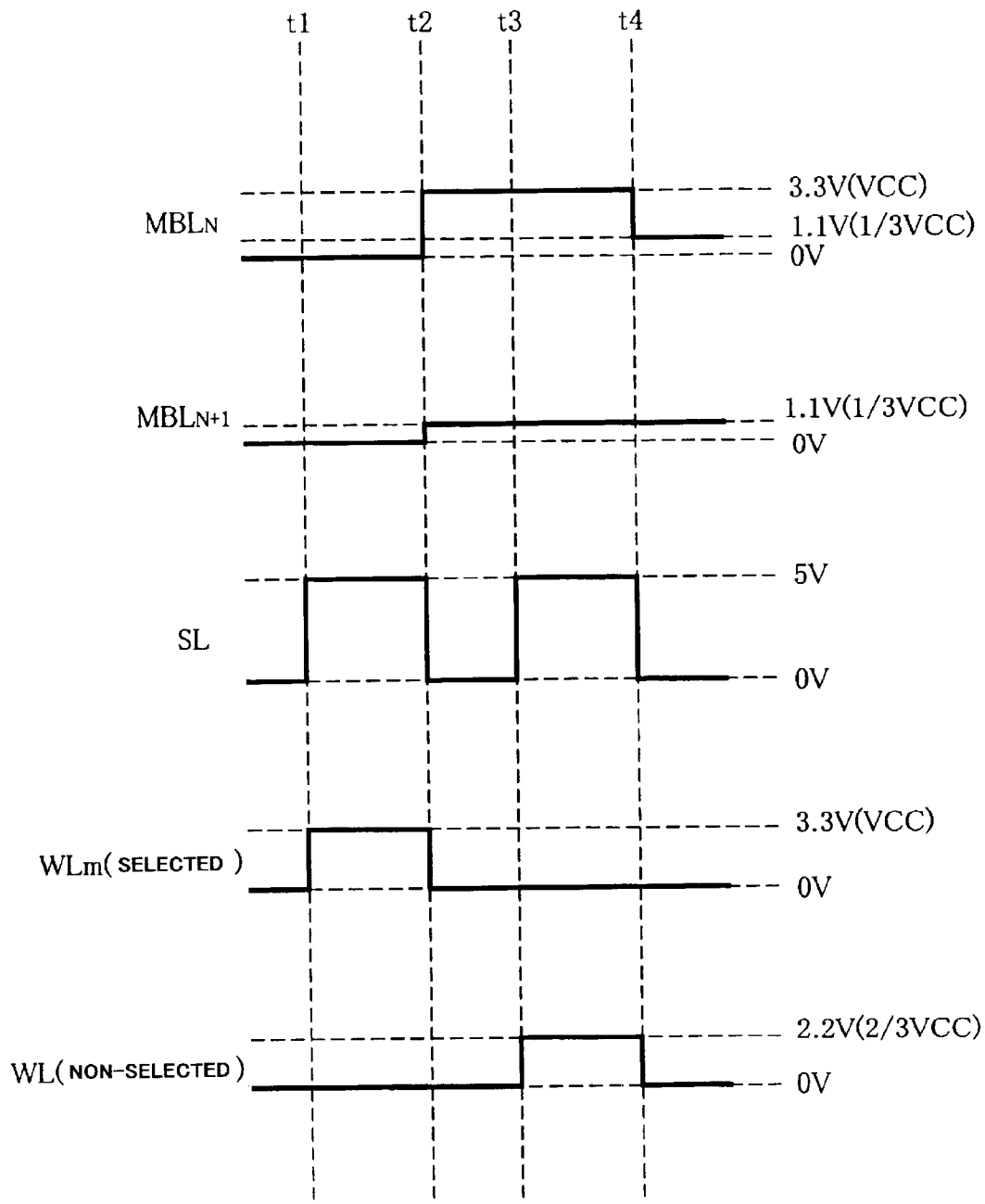
FIG. 8 is a timing chart in the case of writing data "1" into a ferroelectric capacitor Cm,N and writing data "0" into Cm,N+1.
Figure 9:
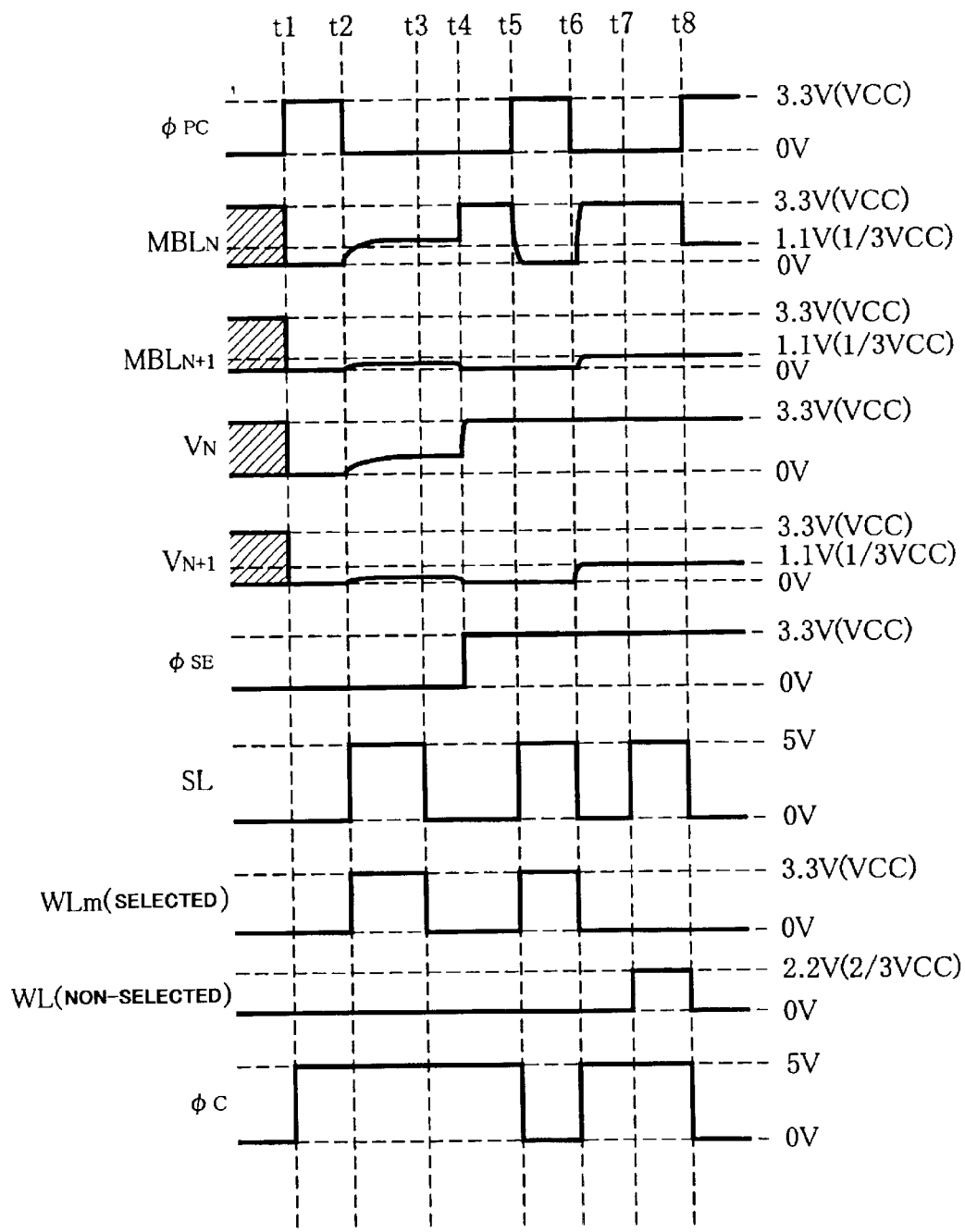
FIG. 9 is a timing chart in the case of reading data "1" stored in the memory cell Cm,N and reading data "0" stored in the memory cell Cm,N+1, and rewriting data "1" into the memory cell Cm,N and rewriting data "o" into Cm,N+1.

6. Experimental Example (1) The relation between the difference between the switching polarization and non-switching polarization (Psw-Pns) and the write voltage Vs was examined. FIG. 6 is a graph showing the relation between the difference between the switching polarization and non-switching polarization and the write voltage. Table 1 shows data on the difference between the switching polarization and non-switching polarization corresponding to the write voltage. Psw is the difference in polarization in the case of reading data from the memory cell in which the data "0" is written by applying Vs to the memory cell to which (⅓) Vs is applied. Pns is the difference in polarization in the case of reading data from the memory cell in which the data "1" is written by applying Vs to the memory cell to which (–⅓) Vs is applied The experiment was performed under the following conditions. The material for the ferroelectric layer was $SrBi_2Ta_2O_9$. The thickness of the ferroelectric layer was 120 nm. The saturation voltage of this ferroelectric layer was 2.0 V.

As is clear from FIG. 6, in the case where the write voltage Vwrite is less than 2.0 V (saturation voltage), the value "Psw-Pns" is increased in comparison with the case where the write voltage Vwrite is 2.0 V. Therefore, Psw-Pns is increased when the write voltage is less than the saturation voltage.

TABLE 1

| Vs (V) | Psw – Pns ($\mu C/cm^2$) |
| --- | --- |
| 0.6 | 8.5 |
| 0.9 | 12.0 |
| 1.2 | 8.0 |
| 1.5 | 5.0 |
| 1.8 | 2.0 |

(2) The relation between the relative dielectric constant of the material for the ferroelectric layer and the difference between the switching polarization and non-switching polarization (Psw-Pns) was examined. Table 2 shows data on the difference between the switching polarization and non-switching polarization (Pws-Pns) corresponding to the relative dielectric constant of the material for the ferroelectric layer.

In this experiment, the relative dielectric constant is a value when the bias voltage is 0 V. The ferroelectric layer was formed using a solution application process. The thickness of the ferroelectric layer was 120 nm. The write voltage was 1.2 V.

As is clear from Table 2, the difference between the switching polarization and non-switching polarization (Pws- Pns) is increased as the relative dielectric constant is decreased.

TABLE 2

| Material | Relative dielectric constant | Psw – Pns ($\mu C/cm^2$) |
| --- | --- | --- |
| $SrBi_2Ta_2O_9$ | 300 | 8.0 |
| $SrBi_2Ta_{1.8}Nb_{0.2}O_9$ | 250 | 10.0 |
| $SrBi_2Nb_2O_9$ | 170 | 13.0 |

The present invention is not limited to the above embodiment. Various modifications and variations are possible within the scope of the present invention.

What is claimed is:

1. A ferroelectric memory device comprising:

first signal electrodes, a ferroelectric layer, and second signal electrodes, wherein the second signal electrodes are formed along a direction which intersects with the first signal electrodes, wherein memory cells each of which comprises a ferroelectric capacitor including at least one of the first signal electrodes, one of the second signal electrodes, and the ferroelectric layer, are formed in regions in which the first signal electrodes intersect the second signal electrodes, wherein the second signal electrodes and the first signal electrodes are formed in an acute angle direction with respect to each other or are formed in a substantially perpendicular direction with respect to each other, wherein information is written into a selected memory cell by applying a write voltage between one of the first signal electrodes and one of the second signal electrodes in the selected memory cell, and wherein an absolute value of the write voltage is less than an absolute value of a saturation voltage at which remanent polarization of the ferroelectric capacitor is saturated.

2. The ferroelectric memory device according to claim 1, wherein information is read from a selected memory cell by applying a read voltage between one of the first signal electrodes and one of the second signal electrodes in the selected memory cell, and wherein an absolute value of the read voltage is less than an absolute value of a saturation voltage.

3. The ferroelectric memory device according to claim 2, wherein the absolute value of the write voltage is the same as the absolute value of the read voltage.

4. The ferroelectric memory device according to claim 2, wherein, while information is read from a selected memory cell, part of information is written into the selected memory cell.

5. The ferroelectric memory device according to claim 1, wherein a first voltage which prevents polarization inversion of a non-selected memory cell is applied between one of the first signal electrodes and one of the second signal electrodes in the non-selected memory cell when information is written into the selected memory cell, and wherein the maximum absolute value of the first voltage is half of the absolute value of the write voltage.

6. The ferroelectric memory device according to claim 1, wherein a second voltage which prevents polarization inversion of a non-selected memory cell is applied between one of the first signal electrodes and one of the second signal electrodes in the non-selected memory cell when information is read from the selected memory cell, and wherein the maximum absolute value of the second voltage is half of the absolute value of the read voltage.

7. The ferroelectric memory device according to claim 1, wherein the ferroelectric layer is formed of a perovskite-type oxide ferroelectric.

8. The ferroelectric memory device according to claim 1, wherein the ratio of the absolute value of the write voltage to the thickness of the ferroelectric layer is 17 V/$\mu$m or less.

9. The ferroelectric memory device according to claim 1, wherein the ratio of the absolute value of the write voltage to the thickness of the ferroelectric layer is 15 V/$\mu$m or less.

10. The ferroelectric memory device according to claim 1, wherein the ferroelectric layer is formed of a material having a relative dielectric constant of 400 or less in a state in which a bias voltage is not applied.

11. The ferroelectric memory devices according to claim 1, wherein the ferroelectric layer is formed of a material having a relative dielectric constant of 300 or less in a state in which a bias voltage is not applied.

12. The ferroelectric memory device according to claim 1, wherein a first voltage which prevents polarization inversion of a non-selected memory cell is applied between one of the first signal electrodes and one of the second signal electrodes in the non-selected memory cell when information is written into the selected memory cell, and wherein the maximum absolute value of the first voltage is one-third of the absolute value of the write voltage.

13. The ferroelectric memory device according to claim 1, wherein a second voltage which prevents polarization inversion of a non-selected memory cell is applied between one of the first signal electrodes and one of the second signal electrodes in the non-selected memory cell when information is read from the selected memory cell, and wherein the maximum absolute value of the second voltage is one-third of the absolute value of the read voltage.

14. A ferroelectric memory device comprising:

first signal electrodes, a ferroelectric layer, and second signal electrodes, wherein the second signal electrodes are formed along a direction which intersects the first signal electrodes, wherein the second signal electrodes and the first signal electrodes are formed in an acute angle direction with respect to each other or are formed in a substantially perpendicular direction with respect to each other, wherein memory cells each of which comprises a ferroelectric capacitor including at least one of the first signal electrodes, one of the second signal electrodes, and the ferroelectric layer, are formed in regions in which the first signal electrodes intersect the second signal electrodes, wherein information is written into a selected memory cell by applying a write voltage between one of the first signal electrodes and one of the second signal electrodes in the selected memory cell, wherein information is read from the selected memory cell by applying a read voltage between one of the first signal electrodes and one of the second signal electrodes in the selected memory cell, and wherein, provided that the write voltage is ±Vs and the read voltage is one of +Vs and −Vs, |Vs| is less than an absolute value of a saturation voltage at which remanent polarization of the ferroelectric capacitor is saturated.

15. The ferroelectric memory device according to claim wherein a first voltage which prevents polarization inversion of a non-selected memory cell is applied between one of the first signal electrodes and one of the second signal electrodes in the non-selected memory cell when information is written into the selected memory cell, and wherein the maximum absolute value of the first voltage is (½) |Vs|.

16. The ferroelectric memory device according to claim 14, wherein a second voltage which prevents polarization inversion of a non-selected memory cell is applied between one of the first signal electrodes and one of the second signal electrodes in the non-selected memory cell when information is read from the selected memory cell, and wherein the maximum absolute value of the second voltage is (½) |Vs|.

17. The ferroelectric memory device according to claim 14, wherein a first voltage which prevents polarization inversion of a non-selected memory cell is applied between one of the first signal electrodes and one of the second signal electrodes in the non-selected memory cell when information is written into the selected memory cell, and wherein the maximum absolute value of the first voltage is (⅓) |Vs|.

18. The ferroelectric memory device according to claim 14, wherein a second voltage which prevents polarization inversion of a non-selected memory cell is applied between one of the first signal electrodes and one of the second signal electrodes in the non-selected memory cell when information is read from the selected memory cell, and wherein the maximum absolute value of the second voltage is (⅓) |Vs|.

19. A method of operating memory cells including ferroelectric capacitors, wherein each of the memory cells comprises a first signal electrode, a ferroelectric layer, and a second signal electrode, wherein the second signal electrode is formed along a direction which intersects with the first signal electrode, wherein the second signal electrodes and the first signal electrodes are formed in an acute angle direction with respect to each other or are formed in a substantially perpendicular direction with respect to each other, wherein each of the memory cells comprises at least one of the first signal electrode, the second signal electrode, and the ferroelectric layer in a region in which the first signal electrode intersects the second signal electrode, the method comprising:

a step of writing information into a selected memory cell by applying a write voltage between the first signal electrode and the second signal electrode in the selected memory cell, wherein an absolute value of the write voltage is less than an absolute value of a saturation voltage at which remanent polarization of the ferroelectric capacitors is saturated.

20. The method of operating memory cells including ferroelectric memory cells according to claim 19, further comprising:

a step of reading information from the selected memory cell by applying a read voltage between the first signal electrode and the second signal electrode in the selected memory cell, wherein an absolute value of the read voltage is less than an absolute value of a saturation voltage at which remanent polarization of the ferroelectric capacitors is saturated.

21. The method of operating memory cells including ferroelectric memory cells according to claim 20, wherein the absolute value of the write voltage is the same as the absolute value of the read voltage.

22. The method of operating memory cells including ferroelectric memory cells according to claim 20, wherein, while information is read from a selected memory cell, part of information is written into the selected memory cell.

23. The method of operating memory cells including ferroelectric capacitors according to claim 19, wherein a first voltage which prevents polarization inversion of a non-selected memory cell is applied between the first signal electrode and the second signal electrode in the non-selected memory cell when information is written into the selected memory cell, and wherein the maximum absolute value of the first voltage is half of the absolute value of the write voltage.

24. The method of operating memory cells including ferroelectric capacitors according to claim 19, wherein a second voltage which prevents polarization inversion of a non-selected memory cell is applied between the first signal electrode and the second signal electrode in the non-selected memory cell when information is read from the selected memory cell, and wherein the maximum absolute value of the second voltage is half of the absolute value of the read voltage.

25. The method of operating memory cells including ferroelectric capacitors according to claim 19, wherein a first voltage which prevents polarization inversion of a non-selected memory cell is applied between the first signal electrode and the second signal electrode in the non-selected memory cell when information is written into the selected memory cell, and wherein the maximum absolute value of the first voltage is one-third of the absolute value of the write voltage.

26. The method of operating memory cells including ferroelectric capacitors according to claim 19, wherein a second voltage which prevents polarization inversion of a non-selected memory cell is applied between the first signal electrode and the second signal electrode in the non-selected memory cell when information is read from the selected memory cell, and wherein the maximum absolute value of the second voltage is one-third of the absolute value of the read voltage.

27. A method of operating memory cells including ferroelectric capacitors, wherein each of the memory cells comprises a first signal electrode, a ferroelectric layer, and a second signal electrode, wherein the second signal electrode is formed along a direction which intersects with the first signal electrode, wherein the second signal electrodes and the first signal electrodes are formed in an acute angle direction with respect to each other or are formed in a substantially perpendicular direction with respect to each other, wherein each of the memory cells comprises at least one of the first signal electrode, the second signal electrode, and the ferroelectric layer in a region in which the first signal electrode intersects the second signal electrode, the method comprising:

a step of writing information into a the selected memory cell by applying a write voltage between the first signal electrode and the second signal electrode in the selected memory cell, and a step of writing information from the selected memory cell by applying a read voltage between the first signal electrode and the second signal electrode in the selected memory cell, wherein, provided that the write voltage is ±Vs and the read voltage is one of +Vs and −Vs, |Vs| is less than an absolute value of a saturation voltage at which remanent polarization of the ferroelectric capacitors is saturated.

28. The method of operating memory cells including ferroelectric capacitors according to claim 24, wherein a first voltage which prevents polarization inversion of a non-selected memory cell is applied between the first signal electrode and the second signal electrode in the non-selected memory cell when information is written into the selected memory cell, and wherein the maximum absolute value of the first voltage is (½) |Vs|.

29. The method of operating memory cells including ferroelectric capacitors according to claim 27, wherein a second voltage which prevents polarization inversion of a non-selected memory cell is applied between the first signal electrode and the second signal electrode in the non-selected memory cell when information is read from the selected memory cell, and wherein the maximum absolute value of the second voltage is (½) |Vs|.

30. The method of operating memory cells including ferroelectric capacitors according to claim 19, wherein the ferroelectric layer is formed of a perovskite-type oxide ferroelectric.

31. The method of operating memory cells including ferroelectric capacitors according to claim 19, wherein the ratio of the absolute value of the write voltage to the thickness of the ferroelectric layer is 17 V/$\mu$m or less.

32. The method of operating memory cells including ferroelectric capacitors according to claim 19, wherein the ratio of the absolute value of the write voltage to the thickness of the ferroelectric layer is 15 V/$\mu$m or less.

33. The method of operating memory cells including ferroelectric capacitors according to claim 19, wherein the ferroelectric layer is formed of a material having a relative dielectric constant of 400 or less in a state in which a bias voltage is not applied.

34. The method of operating memory cells including ferroelectric capacitors according to claim 19, wherein the ferroelectric layer is formed of a material having a relative dielectric constant of 300 or less in a state in which a bias voltage is not applied.

35. The method of operating memory cells including ferroelectric capacitors according to claim 27, wherein a first voltage which prevents polarization inversion of a non-selected memory cell is applied between the first signal electrode and the second signal electrode in the non-selected memory cell when information is written into the selected memory cell, and wherein the maximum absolute value of the first voltage is (⅓) |Vs|.

36. The method of operating memory cells including ferroelectric capacitors according to claim 27, wherein a second voltage which prevents polarization inversion of a non-selected memory cell is applied between the first signal electrode and the second signal electrode in the non-selected memory cell when information is read from the selected memory cell, and wherein the maximum absolute value of the second voltage is (⅓) |Vs|.

* * * * *